United States Patent
Kwon et al.

(10) Patent No.: US 11,211,466 B2
(45) Date of Patent: Dec. 28, 2021

(54) SEMICONDUCTOR DEVICE HAVING AN AIR GAP AND METHOD FOR FABRICATING THE SAME

(71) Applicant: SK hynix Inc., Gyeonggi-do (KR)

(72) Inventors: Se-Han Kwon, Gyeonggi-do (KR); Dong-Soo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/828,250

(22) Filed: Mar. 24, 2020

(65) Prior Publication Data

US 2021/0066466 A1    Mar. 4, 2021

(30) Foreign Application Priority Data

Sep. 2, 2019 (KR) .................. 10-2019-0108106

(51) Int. Cl.
| | |
|---|---|
| *H01L 21/3213* | (2006.01) |
| *H01L 21/02* | (2006.01) |
| *H01L 29/49* | (2006.01) |
| *H01L 21/3105* | (2006.01) |
| *H01L 29/423* | (2006.01) |
| *H01L 27/108* | (2006.01) |

(Continued)

(52) U.S. Cl.
CPC ...... *H01L 29/4236* (2013.01); *H01L 21/0217* (2013.01); *H01L 21/28088* (2013.01); *H01L 21/31056* (2013.01); *H01L 21/32136* (2013.01); *H01L 21/67075* (2013.01); *H01L 27/10823* (2013.01); *H01L 27/10876* (2013.01); *H01L 29/4238* (2013.01); *H01L 29/42368* (2013.01); *H01L 29/4966* (2013.01); *H01L 29/4991* (2013.01)

(58) Field of Classification Search
CPC ............... H01L 29/4991; H01L 29/515; H01L 27/10823; H01L 27/10876; H01L 29/4236; H01L 29/42356–4236
See application file for complete search history.

(56) References Cited

U.S. PATENT DOCUMENTS

| | | | |
|---|---|---|---|
| 9,224,619 B2 | 12/2015 | Yi et al. | |
| 9,449,830 B2 * | 9/2016 | Kang | .................... H01L 27/228 |
| 10,049,932 B2 * | 8/2018 | Barth | ................ H01L 21/02203 |

(Continued)

OTHER PUBLICATIONS

Alam M., A Tutorial Introduction to Negative Capacitor Field Effect Transistors: Perspective on The Road Ahead, Presentation, Dec. 3, 2015, pp. 1-57, Muhammad A. Alam, West Lafayette, IN.

(Continued)

*Primary Examiner* — Eva Y Montalvo
*Assistant Examiner* — William Henry Anderson
(74) *Attorney, Agent, or Firm* — IP & T Group LLP

(57) ABSTRACT

Disclosed is a semiconductor device for improving a gate induced drain leakage and a method for fabricating the same, and the method may include forming a trench in a substrate, lining a surface of the trench with an initial gate dielectric layer, forming a gate electrode to partially fill the lined trench, forming a sacrificial material spaced apart from a top surface of the gate electrode and to selectively cover a top corner of the lined trench, removing a part of the initial gate dielectric layer of the lined trench which is exposed by the sacrificial material in order to form an air gap, and forming a capping layer to cap a side surface of the air gap, over the gate electrode.

19 Claims, 13 Drawing Sheets

(51) Int. Cl.
*H01L 21/67* (2006.01)
*H01L 21/28* (2006.01)

(56) References Cited

U.S. PATENT DOCUMENTS

| | | | |
|---|---|---|---|
| 10,134,740 B2* | 11/2018 | Kim | H01L 29/4236 |
| 2015/0179468 A1* | 6/2015 | Ashraf | H01L 21/30655 |
| | | | 257/622 |
| 2017/0186844 A1* | 6/2017 | Kim | H01L 29/517 |

OTHER PUBLICATIONS

Karda K. et al., An anti-ferroelectric gated Landau transistor to achieve sub-60 mV/dec switching at low voltage and high speed, Applied Physics Letters, Apr. 2015, 163501-163501-5, vol. 106 Issue:16, Online.

Jain A. et al., IEEE Transactions on Electron Devices, Stability Constraints Define the Minimum Subthreshold Swing of a Negative Capacitance Field-Effect Transistor, Journal, Jul. 2014, pp. 2235-2242, vol. 61 Issue:7, IEEE, Online.

* cited by examiner

SEMICONDUCTOR DEVICE HAVING AN AIR GAP AND METHOD FOR FABRICATING THE SAME

CROSS-REFERENCE TO RELATED APPLICATIONS

The present application claims priority to Korean Patent Application No. 10-2019-0108106, filed on Sep. 2, 2019, which is incorporated herein by reference in its entirety.

BACKGROUND

1. Field

Various embodiments relate generally to a semiconductor device, and particularly, to a semiconductor device having a buried gate structure and a method for fabricating the same.

2. Description of the Related Art

A metal gate electrode is applied for high performance of a transistor. Particularly, a buried gate type transistor requires control of a threshold voltage for a high-performance operation. In addition, gate induced drain leakage (GIDL) characteristics greatly affect the performance of the buried gate type transistor.

SUMMARY

Various embodiments of the present invention are directed to a semiconductor device having a buried gate structure that may improve a gate induced drain leakage (GIDL), and a method for fabricating the same.

In accordance with an embodiment, a method for fabricating a semiconductor device may include: forming a trench in a substrate; lining a surface of the trench with an initial gate dielectric layer; forming a gate electrode to partially fill the lined trench; forming a sacrificial material spaced apart from a top surface of the gate electrode and to selectively cover a top corner of the lined trench; removing a part of the initial gate dielectric layer of the lined trench which is exposed by the sacrificial material in order to form an air gap; and forming a capping layer to cap a side surface of the air gap over the gate electrode.

In accordance with an embodiment, a method for fabricating a semiconductor device may include: forming a trench in a substrate; lining a surface of the trench with an initial gate dielectric layer; forming a lower buried portion to partially fill the lined trench; forming an upper buried portion over the lower buried portion; forming a sacrificial material spaced apart from a top surface of the upper buried portion and to selectively cover a top corner of the lined trench; removing a part of the initial gate dielectric layer of the lined trench which is exposed by the sacrificial material in order to form an air gap that horizontally overlaps side walls of the upper buried portion; and forming a capping layer to cap a side surface of the air gap over the upper buried portion.

In accordance with an embodiment, a semiconductor device may include: a substrate including a trench; a gate electrode and a capping layer which are sequentially stacked to fill the trench; and a gate dielectric structure that is conformally formed along a surface of the trench and includes an air gap to partially cover side walls of the gate electrode and side walls of the capping layer.

DETAILED DESCRIPTION

Figure 1:
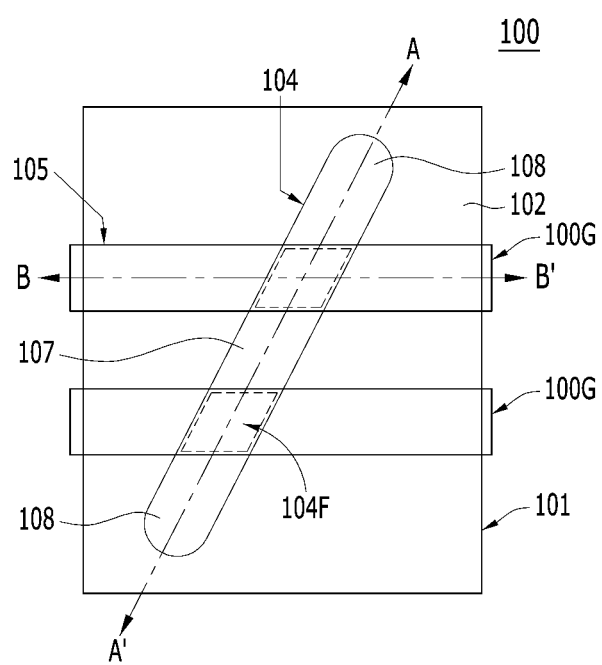
FIG. 1 is a plan view illustrating a semiconductor device in accordance with an embodiment of the present disclosure.

Various embodiments described herein may be described with reference to cross-sectional views, plane views and block diagrams, which are ideal schematic views of the semiconductor device according to specific embodiments of the present invention. It is noted that the structures of the drawings may be modified by fabricating techniques and/or tolerances. The present invention is not limited to the described embodiments and the specific structures shown in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate specific structures of regions of the elements, and are not intended to limit the scope of the invention.

Hereinafter, in various embodiments of the semiconductor device, a threshold voltage Vt may depend on a flat-band voltage VFB and the flat-band voltage VFB may depend on a work function. The work function may be adjusted by various methods. For example, the work function may be adjusted by the type of material employed for the gate electrode, or for the material employed between the gate electrode and the channel of a memory cell. Adjusting the work function may cause the flat-band voltage to shift. Generally, increasing the work function may shift the flat-band voltage in a positive direction, and decreasing the work function may shift the flat-band voltage in a negative direction. This way, the threshold voltage may be modulated by shifting the flat-band voltage. In various embodiments, the threshold voltage may be modulated by shifting the flat-band voltage even when the channel concentration is reduced or channel doping is omitted. In particular, the flat-band voltage may be lowered by employing a material having a low work function or an air gap, thereby improving a gate induced drain leakage (GIDL).

Hereinafter, in various embodiments of the semiconductor device, a buried gate structure may be located in a trench. The buried gate structure may include a stack of a gate dielectric layer, a gate electrode and a capping layer. The gate dielectric layer may cover a surface of the trench, and the gate electrode may be formed on the gate dielectric layer.

The gate electrode may partially fill the trench, and the capping layer may fill the other portions of the trench on the gate electrode. The gate electrode may be referred to as a "buried gate electrode".

The gate electrode may include a single gate or a dual gate. The single gate may refer to a gate formed of polysilicon or a metal-based material only. The single gate may include a polysilicon single gate or a metal single gate. The dual gate may refer to a bilayer stack of different gate electrodes. The dual gate may include the same metal dual gate formed of a stack of the same metals, a different metal dual gate formed of a stack of different metals or a different material dual gate formed of a stack of a metal and polysilicon.

The gate electrode may include a barrier layer and a low resistance material. The barrier layer may serve to block an impurity diffused from the low resistance material or to prevent mutual diffusion and reaction between different materials. The low resistance material may serve to decrease sheet resistance of the gate electrode.

The gate electrode may include a material having an engineered work function. The engineering of the work function may refer to a material or method that may adjust the work function to have a decreased work function, i.e., a low work function, or an increased work function, i.e., a high work function.

In various embodiments of the semiconductor device, the gate electrode may include a lower buried portion LB and an upper buried portion UB. The lower buried portion LB may fill a lower portion of the trench, and the upper buried portion UB may fill a middle or upper portion of the trench on the lower buried portion LB. The gate electrode may be referred to as a dual gate in which the upper buried portion UB is located on the lower buried portion LB. The lower buried portion LB may overlap a channel, and the upper buried portion UB may laterally overlap first and second doped regions. Each of the first and second doped regions may be referred to as a source/drain region.

Figure 2A:
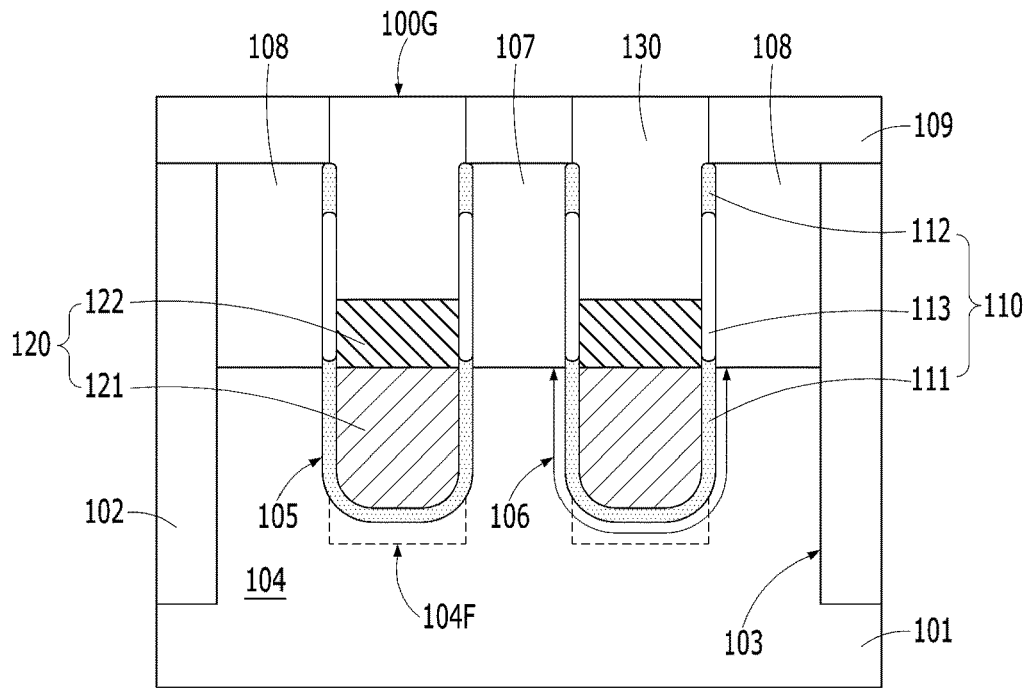
FIG. 2A is a cross-sectional view illustrating the semiconductor device taken along an A-A' line illustrated in FIG. 1.
Figure 2B:
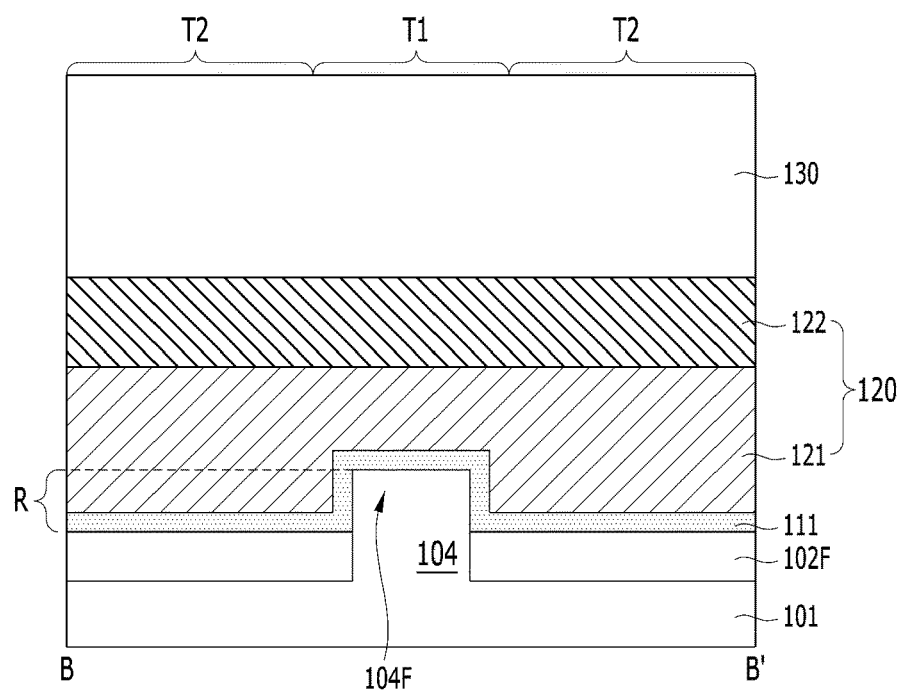
FIG. 2B is a cross-sectional view illustrating the semiconductor device taken along a B-B' line illustrated in FIG. 1.

FIG. 1 is a plan view illustrating a semiconductor device 100 in accordance with an embodiment. FIG. 2A is a cross-sectional view illustrating the semiconductor device 100 taken along an A-A' line illustrated in FIG. 1. FIG. 2B is a cross-sectional view illustrating the semiconductor device 100 taken along a B-B' line illustrated in FIG. 1.

Referring to FIGS. 1 to 2B, the semiconductor device 100 may include a substrate 101 and a buried gate structure 100G embedded in the substrate 101. The semiconductor device 100 may be a part of a memory cell. For example, the semiconductor device 100 may be a part of a memory cell of a DRAM.

The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include an III/V-group semiconductor substrate, for example, a chemical compound semiconductor substrate such as gallium arsenide (GaAs). The substrate 101 may include a Silicon-On-Insulator (SOI) substrate.

An isolation layer 102 and an active region 104 may be formed in the substrate 101. The active region 104 may be defined by the isolation layer 102. The isolation layer 102 may be a Shallow Trench Isolation (STI) region formed by trench etching. The isolation layer 102 may be formed by filling a shallow trench, for example, an isolation trench 103, with a dielectric material. The isolation layer 102 may include silicon oxide, silicon nitride or a combination thereof.

A trench 105 may be formed in the substrate 101. Referring to FIG. 1, the trench 105 may have a line shape extended in any one direction. The trench 105 may have a line shape crossing the active region 104 and the isolation layer 102. The trench 105 may have a shallower depth than the isolation trench 103. In some embodiments, the bottom portion of the trench 105 may have a curvature. The trench 105 provides a space in which the buried gate structure 100G is formed, and may be referred to as a "gate trench".

A first doped region 107 and a second doped region 108 may be formed in the active region 104. The first and second doped regions 107 and 108 are regions doped with conductive dopants. For example, the conductive dopants may include phosphorus (P), arsenic (As), antimony (Sb) or boron (B). The first and second doped regions 107 and 108 may be doped with the same type of conductive dopants. The first and second doped regions 107 and 108 may be located in the active region 104 on both sides of the trench 105. The bottom surfaces of the first and second doped regions 107 and 108 may be located at a predetermined depth from the top surface of the active region 104. The first and second doped regions 107 and 108 may contact the side walls of the trench 105. The bottom surfaces of the first and second doped regions 107 and 108 may be higher than the bottom surface of the trench 105. The first doped region 107 may be referred to as a "first source/drain region", and the second doped region 108 may be referred to as a "second source/drain region". A channel 106 may be defined between the first doped region 107 and the second doped region 108 by the buried gate structure 100G. The channel 106 may be defined along the profile of the trench 105.

The trench 105 may include a first trench T1 and a second trench T2. The first trench T1 may be formed in the active region 104. The second trench T2 may be formed in the isolation layer 102. The trench 105 may have a shape that is continuously extended from the first trench T1 to the second trench T2. In the trench 105, the bottom surfaces of the first and second trenches T1 and T2 may be located at different levels. For example, the bottom surface of the first trench T1 may be located at a higher level than the bottom surface of the second trench T2. A difference in height between the first trench T1 and the second trench T2 may be formed as the isolation layer 102 is recessed. Thus, the second trench T2 may include a recessed region R having a bottom surface that is lower than the bottom surface of the first trench T1. A fin region 104F may be formed in the active region 104 due to the step change in depth between the first trench T1 and the second trench T2. Thus, the active region 104 may include the fin region 104F.

As such, the fin region 104F may be formed below the first trench T1, and the side walls of the fin region 104F are exposed by a recessed isolation layer 102F. The fin region 104F is a region in which a part of the channel CH may be formed. The fin region 104F is called a "saddle fin". The fin region 104F may increase the channel width and improve the electrical characteristics.

In some embodiments, the fin region 104F may be omitted.

The buried gate structure 100G may include a gate dielectric structure 110 covering the bottom surface and side walls of the trench 105, and a gate electrode 120 and a capping layer 130 which are sequentially stacked to fill the trench 105 on the gate dielectric structure 110. The gate electrode 120 may include a lower buried portion 121 and an upper buried portion 122. The lower buried portion 121 may fill the lower portion of the trench 105 on the gate dielectric structure 110, and the upper buried portion 122 may fill the middle portion of the trench 105 on the lower buried portion 121. The capping layer 130 may fill the upper portion of the trench 105 on the upper buried portion 122. The lower, middle and upper portions of the trench 105 are for convenience in description, and the heights or depths thereof may be the same as or different from each other.

The gate dielectric structure 110 may include a first gate dielectric layer 111, a second gate dielectric layer 112 and an air gap 113. The air gap 113 may be located between the first gate dielectric layer 111 and the second gate dielectric layer 112. The air gap 113 may be vertically formed between the first gate dielectric layer 111 and the second gate dielectric layer 112. The air gap 113 may be referred to as a "vertical air gap".

The first gate dielectric layer 111 may be formed on the lower portion of the trench 105. For example, the first gate dielectric layer 111 may be conformally formed on the bottom surface and lower side walls of the trench 105. The first gate dielectric layer 111 may include silicon oxide, silicon nitride, silicon oxynitride, a high-k material or combinations thereof. The high-k material may include a material having a higher dielectric constant than silicon oxide. For example, the high-k material may include a material having a higher dielectric constant than 3.9. In some embodiments, the high-k material may include a material having a higher dielectric constant than 10. In some embodiments, the high-k material may include a material having a dielectric constant ranging from 10 to 30. The high-k material may include at least one metallic element. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The first gate dielectric layer 111 may include metal oxide. The first gate dielectric layer 111 may have a shape of surrounding the bottom surface and side walls of the lower buried portion 121. The first gate dielectric layer 111 may be located between the channel 106 and the lower buried portion 121.

The second gate dielectric layer 112 may be formed on the upper portion of the trench 105. For example, the second gate dielectric layer 112 may be formed on the upper side walls of the trench 105. The first and second gate dielectric layers 111 and 112 may be formed of the same material. The second gate dielectric layer 112 may include silicon oxide, silicon nitride, silicon oxynitride, a high-k material or combinations thereof. The second gate dielectric layer 112 may contact the first and second doped regions 107 and 108. The second gate dielectric layer 112 may contact the side walls of the capping layer 130. The second gate dielectric layer 112 may partially cover the side walls of the capping layer 130. The second gate dielectric layer 112 may partially cover the side walls of the first and second doped regions 107 and 108.

The air gap 113 may be formed between the first gate dielectric layer 111 and the second gate dielectric layer 112. The air gap 113 may partially cover the side walls of the capping layer 130. The air gap 113 may partially cover the side walls of the first and second doped regions 107 and 108. The air gap 113 may partially cover the side walls of the upper buried portion 122.

As described above, the air gap 113 may have a shape of partially covering the side walls of the capping layer 130, the side walls of the first and second doped regions 107 and 108 and the side walls of the upper buried portion 122. The bottom surface of the air gap 113 may be located at a higher level than or the same level as the top surface of the lower buried portion 121. The top surface of the air gap 113 may be located at a higher level than the top surface of the upper buried portion 122.

The air gap 113 may be horizontally located between the first and second doped regions 107 and 108 and the upper buried portion 122. The air gap 113 may be located between the side walls of the capping layer 130 and the side walls of the first and second doped regions 107 and 108.

The gate electrode 120 may be located at a lower level than the top surface of the active region 104. The lower buried portion 121 may have a shape which fills the lower portion of the trench 105. The lower buried portion 121 may be formed of a low-resistance material to decrease gate sheet resistance. The lower buried portion 121 may be formed of a metal-based material. The lower buried portion 121 may include, for example, a metal, metal nitride or a combination thereof. The lower buried portion 121 may include tantalum nitride (TaN), titanium nitride (TiN), tungsten (W), tungsten nitride (WN) or combinations thereof. The lower buried portion 121 may be formed of titanium nitride only. In addition, the lower buried portion 121 may be formed of a stack of titanium nitride (TiN) and tungsten (W), i.e., TiN/W.

In some embodiments, the lower buried portion 121 may have a high work function. The high work function refers to a work function that is higher than a mid-gap work function of silicon. A low work function refers to a work function that is lower than the mid-gap work function of silicon. Specifically, the high work function may be higher than 4.5 eV, and the low work function may be lower than 4.5 eV. The lower buried portion 121 may include P-type polysilicon.

In some embodiments, the lower buried portion 121 may have an increased high work function. The lower buried portion 121 may include metal silicon nitride. The metal silicon nitride may be metal nitride doped with silicon. The lower buried portion 121 may include metal silicon nitride having an adjusted atomic percent of silicon. For example, the lower buried portion 121 may include tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The upper buried portion 122 may be formed on the lower buried portion 121. The top surface of the upper buried portion 122 may be located at a lower level than the top surface of the active region 104. The upper buried portion 122 may have a shape which partially fills the middle portion of the trench 105. The upper and lower buried portions 122 and 121 may be the same material or different materials.

The upper buried portion 122 may be a low-resistance material to decrease gate sheet resistance. The upper buried portion 122 may be a metal-based material. The upper buried portion 122 may include a metal, metal nitride or a combination thereof. The upper buried portion 122 may include tantalum nitride (TaN), titanium nitride (TiN), tungsten (W), tungsten nitride (WN) or combinations thereof. The upper buried portion 122 may be formed of titanium nitride only. In addition, the upper buried portion 122 may be formed of a stack of titanium nitride (TiN) and tungsten (W), i.e., TiN/W. In some embodiments, each of the lower and upper buried portions 121 and 122 may be formed of titanium nitride only. In addition, each of the lower and upper buried portions 121 and 122 may be formed of a stack of titanium nitride (TiN) and tungsten (W), i.e., TiN/W. The upper buried portion 122 may have a smaller height than the lower buried portion 121, and thus the volume of the lower buried portion 121 occupied in the trench 105 may be larger.

In some embodiments, the upper buried portion 122 may have a low work function. The upper buried portion 122 may include N-type polysilicon. In some embodiments, the lower buried portion 121 may be P-type polysilicon, and the upper buried portion 122 may be N-type polysilicon. Further, the lower buried portion 121 may be formed of a stack of titanium nitride and tungsten (TiN/W), and the upper buried portion 122 may be N-type polysilicon.

In the present embodiment, the lower buried portion 121 may be a low-resistance metal-based material, and the upper buried portion 122 may be a material having a low work function. The lower buried portion 121 may be titanium nitride (TiN) or the stack of titanium nitride and tungsten (TiN/W). The upper buried portion 122 may be the N-type polysilicon.

The capping layer 130 serves to protect the upper buried portion 122. The capping layer 130 may fill the upper portion of the trench 105 on the upper buried portion 122. The top surface of the capping layer 130 may be located at the same level as the top surfaces of the first and second doped regions 107 and 108. The capping layer 130 may include a dielectric material. The capping layer 130 may include silicon nitride, silicon oxynitride or a combination thereof. In some embodiments, the capping layer 130 may include a combination of silicon nitride and silicon oxide. The capping layer 130 may include a silicon nitride liner and a Spin-On-Dielectric (SOD) material. A portion of the side walls of the capping layer 130 may directly contact the second gate dielectric layer 112. The bottom surface of the capping layer 130 may directly contact the upper buried portion 122.

A hard mask layer 109 may be formed on the side walls of the capping layer 130. The hard mask layer 109 may be a dielectric material. The hard mask layer 109 may be formed on the substrate 101, and cover the active region 104 and the isolation layer 102.

As described above, the gate dielectric structure 110 may include the air gap 113, the GIDL may be improved by the air gap 113.

Specifically, strong electrical fields are generated between the gate electrode 120 and the first and second doped regions 107 and 108. Due to the strong electrical fields, the GIDL may occur.

When the air gap 113 is disposed between the gate electrode 120 and the first and second doped regions 107 and 108 in the semiconductor device 100 according to the present embodiment, a dielectric constant between the gate electrode 120 and the first and second doped regions 107 and 108 is decreased. Due to the decrease in the dielectric constant, the electric fields are reduced, thereby decreasing leakage current. In particular, since no dielectric materials other than the air gap 113 are formed between the upper buried portion 122 and the first and second doped regions 107 and 108, the GIDL may be further improved. As a comparative example, when the air gap 113 and a dielectric material having a higher dielectric constant than the air gap 113 are present, there is a limit in reducing the GIDL as compared to the case in which the air gap 113 is only present.

Figure 3:
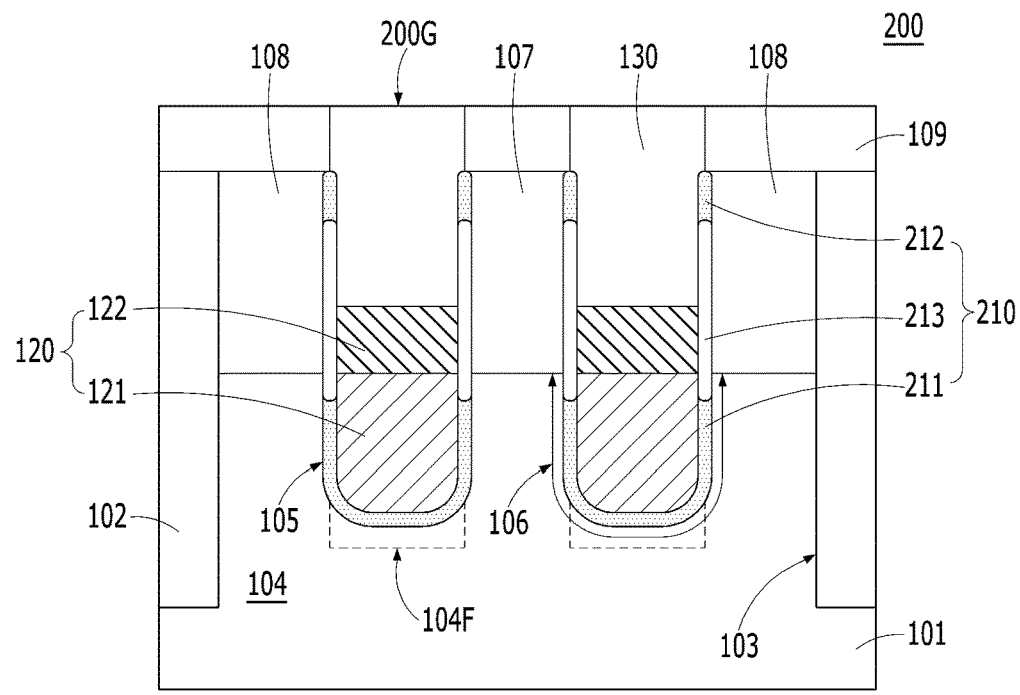
FIGS. 3 to 7 are cross-sectional views illustrating a semiconductor device in accordance with an embodiment of the present disclosure.

FIG. 3 is a cross-sectional view illustrating a semiconductor device 200 in accordance with an embodiment. The other configurations of the semiconductor device 200 illustrated in FIG. 3 may be similar to those of the semiconductor device 100 illustrated in FIG. 2A, except for a buried gate structure 200G. Hereinafter, in the present embodiment, detailed descriptions of configurations overlapping with those of the semiconductor device 100 will be omitted.

Referring to FIG. 3, the semiconductor device 200 may include the buried gate structure 200G, a first doped region 107 and a second doped region 108. An isolation layer 102 and an active region 104 may be formed in a substrate 101. The first and second doped regions 107 and 108 may be formed in the active region 104. A trench that crosses the active region 104 and the isolation layer 102, that is, a trench 105, may be formed. The buried gate structure 200G may be formed in the trench 105. A channel 106 may be formed between the first doped region 107 and the second doped region 108 by the buried gate structure 200G. The channel 106 may be defined along the profile of the trench 105.

The buried gate structure 200G may be embedded in the trench 105. The buried gate structure 200G may be extended into the isolation layer 102 while being disposed in the active region 104 between the first doped region 107 and the second doped region 108. A fin region 104F may be located in the active region 104 below the buried gate structure 200G.

The buried gate structure 200G may include a gate dielectric structure 210 covering the bottom surface and side walls of the trench 105, and a gate electrode 120 and a capping layer 130 which are sequentially stacked to fill the trench 105 on the gate dielectric structure 210. The gate electrode 120 may include a stack of a lower buried portion 121 and an upper buried portion 122.

The gate dielectric structure 210 may include a first gate dielectric layer 211, a second gate dielectric layer 212 and an air gap 213. The air gap 213 may be located between the first gate dielectric layer 211 and the second gate dielectric layer 212. The air gap 213 may be vertically formed between the first gate dielectric layer 211 and the second gate dielectric layer 212.

The first gate dielectric layer 211 may have a shape surrounding the bottom surface and side walls of the lower buried portion 121. The first gate dielectric layer 211 may be located between the channel 106 and the lower buried portion 121.

The second gate dielectric layer 212 may be formed over the trench 105. For example, the second gate dielectric layer 212 may be formed on the upper side walls of the trench 105. The first and second gate dielectric layers 211 and 212 may be formed of the same material. The first and second gate dielectric layers 211 and 212 may include silicon oxide, silicon nitride, silicon oxynitride, a high-k material, or combinations thereof. The second gate dielectric layer 212 may contact the first and second doped regions 107 and 108. The second gate dielectric layer 212 may contact the side walls of the capping layer 130. The second gate dielectric layer 212 may partially cover the side walls of the capping layer 130. The second gate dielectric layer 212 may partially cover the side walls of the first and second doped regions 107 and 108.

The air gap 213 may partially cover the side walls of the capping layer 130. The air gap 213 may partially cover the side walls of the first and second doped regions 107 and 108. The air gap 213 may fully cover the side walls of the upper buried portion 122. The air gap 213 may partially cover the upper side walls of the lower buried portion 121.

As described above, the air gap 213 may have a shape which partially covers the side walls of the capping layer 130, the side walls of the first and second doped regions 107 and 108 and the side walls of the lower buried portion 121. In addition, the air gap 213 may fully cover the side walls of the upper buried portion 122. The air gap 113 of FIG. 2A may not cover the upper side walls of the lower buried portion 121, but the air gap 213 of FIG. 3 may partially cover the upper side walls of the lower buried portion 121. The air gap 213 of FIG. 3 may have a larger height than the air gap 113 of FIG. 2A. The bottom surface of the air gap 213 may be located at a lower level than the top surface of the lower buried portion 121. The top surface of the air gap 213 may be located at a higher level than the top surface of the upper buried portion 122.

The air gap 213 may be horizontally located between the first and second doped regions 107 and 108 and the upper buried portion 122. The air gap 213 may be horizontally located between the side walls of the capping layer 130 and the side walls of the first and second doped regions 107 and 108.

Figure 4:
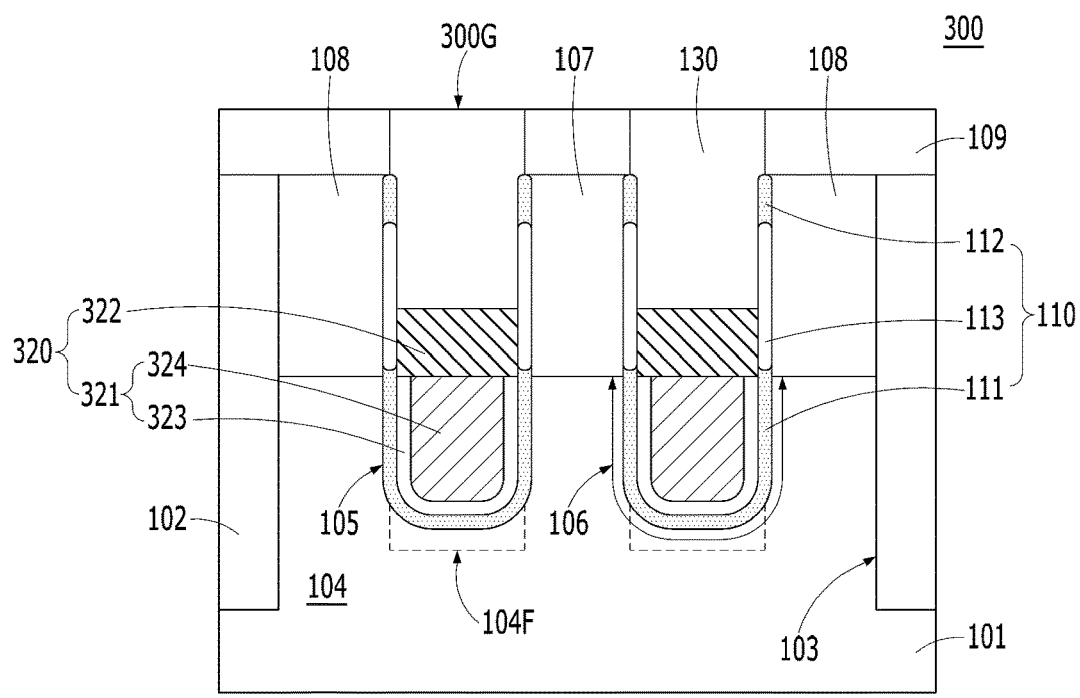

FIG. 4 is a cross-sectional view illustrating a semiconductor device 300 in accordance with an embodiment. The other configurations of the semiconductor device 300 illustrated in FIG. 4 may be similar to those of the semiconductor device 100 illustrated in FIG. 2A, except for a buried gate structure 300G. Hereinafter, in the present embodiment, detailed descriptions of configurations overlapping with those of the semiconductor device 100 will be omitted.

Referring to FIG. 4, the semiconductor device 300 may include the buried gate structure 300G.

The buried gate structure 300G may include a gate dielectric structure 110 covering the bottom surface and side walls of a trench 105, and a gate electrode 320 and a capping layer 130 which are sequentially stacked to fill the trench 105 on the gate dielectric structure 110. The gate electrode 320 may include a stack of a lower buried portion 321 and an upper buried portion 322. The lower buried portion 321 may include a barrier layer 323 and a low resistance gate electrode 324.

Each of the barrier layer 323 and the low resistance gate electrode 324 may include a low resistance material to decrease sheet resistance of the gate electrode 320. Each of the barrier layer 323 and the low resistance gate electrode 324 may be a metal-based material. The barrier layer 323 may include metal nitride. The barrier layer 323 may be formed of tantalum nitride (TaN) or titanium nitride (TiN). In some embodiments, the barrier layer 323 may have a high work function. The high work function refers to a work function that is higher than a mid-gap work function of silicon. A low work function refers to a work function that is lower than the mid-gap work function of silicon. Specifically, the high work function may be higher than 4.5 eV, and the low work function may be lower than 4.5 eV. In some embodiments, the barrier layer 323 may have an increased high work function. The barrier layer 323 may include metal silicon nitride. The metal silicon nitride may be metal nitride doped with silicon. The barrier layer 323 may include metal silicon nitride having an adjusted atomic percent of silicon. For example, the barrier layer 323 may be tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The low resistance gate electrode 324 may include a metal or metal nitride. The low resistance gate electrode 324 may include tungsten or titanium nitride. When tungsten is used as the low resistance gate electrode 324, a first gate dielectric layer 111 may be attacked. For example, a tungsten layer may be deposited using tungsten hexafluoride ($WF_6$) gas, and at this time, the first gate dielectric layer 111 may be attacked by fluorine. Accordingly, the barrier layer 323 may be formed between the low resistance gate electrode 324 and the first gate dielectric layer 111 to prevent fluorine from attacking the first gate dielectric layer 111. In the present embodiment, the low resistance gate electrode 324 may be formed of tungsten (W), and the barrier layer 323 may be formed of titanium nitride (TiN). Accordingly, the lower buried portion 321 may include a stack of TiN/W. The upper buried portion 322 may include a low work function material. The upper buried portion 322 may include N-type polysilicon.

An air gap 113 of FIG. 4 may be increased in height in the same manner as the air gap 213 of FIG. 3.

Figure 5:
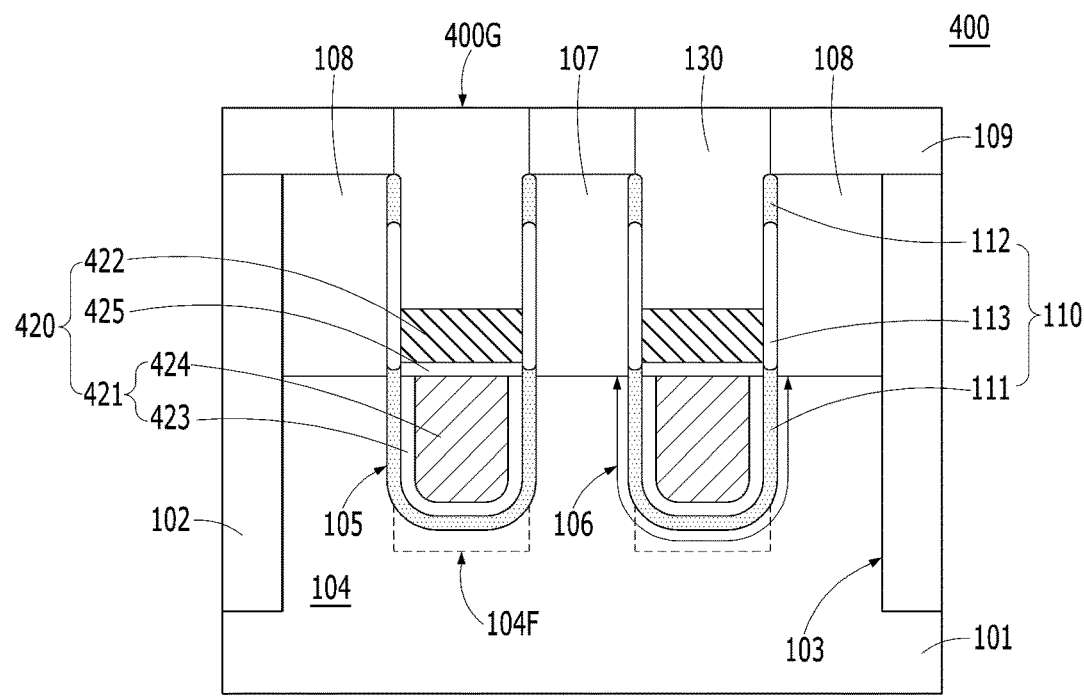

FIG. 5 is a cross-sectional view illustrating a semiconductor device 400 in accordance with an embodiment of the present disclosure. The other configurations of the semiconductor device 400 illustrated in FIG. 5 may be similar to those of the semiconductor device 300 illustrated in FIG. 4, except for a buried gate structure 400G. Hereinafter, in the present embodiment, detailed descriptions of configurations overlapping with those of the semiconductor device 400 will be omitted. Referring to FIG. 5, the semiconductor device 400 may include the buried gate structure 400G.

The buried gate structure 400G may include a gate dielectric structure 110 covering the bottom surface and side walls of a trench 105, and a gate electrode 420 and a capping layer 130 which are sequentially stacked to fill the trench 105 on the gate dielectric structure 110. The gate electrode 420 may include a stack of a lower buried portion 421 and an upper buried portion 422. The lower buried portion 421 may include a first barrier layer 423 and a low resistance gate electrode 424. A second barrier layer 425 may be formed between the lower buried portion 421 and the upper buried portion 422.

The first barrier layer 423 and the low resistance gate electrode 424 may correspond to the barrier layer 323 and the low resistance gate electrode 324 of FIG. 4, respectively. For example, the low resistance gate electrode 424 may be formed of tungsten (W), and the first barrier layer 423 may be formed of titanium nitride (TiN). Accordingly, the lower buried portion 421 may include a stack of TiN/W. The upper buried portion 422 may include a low work function material. The upper buried portion 422 may include N-type polysilicon.

The second barrier layer 425 may be formed on the low resistance gate electrode 424. The second barrier layer 425 may be formed between the low resistance gate electrode 424 and the upper buried portion 422. The first and second barrier layers 423 and 425 may be the same material or different materials. The second barrier layer 425 may include metal nitride. The second barrier layer 425 may be formed of tantalum nitride (TaN) or titanium nitride (TiN). The second barrier layer 425 may be formed by a deposition method such as physical vapor deposition, which is to be described.

In some embodiments, an air gap 113 of FIG. 5 may be increased in height in the same manner as the air gap 213 of FIG. 3.

Figure 6:
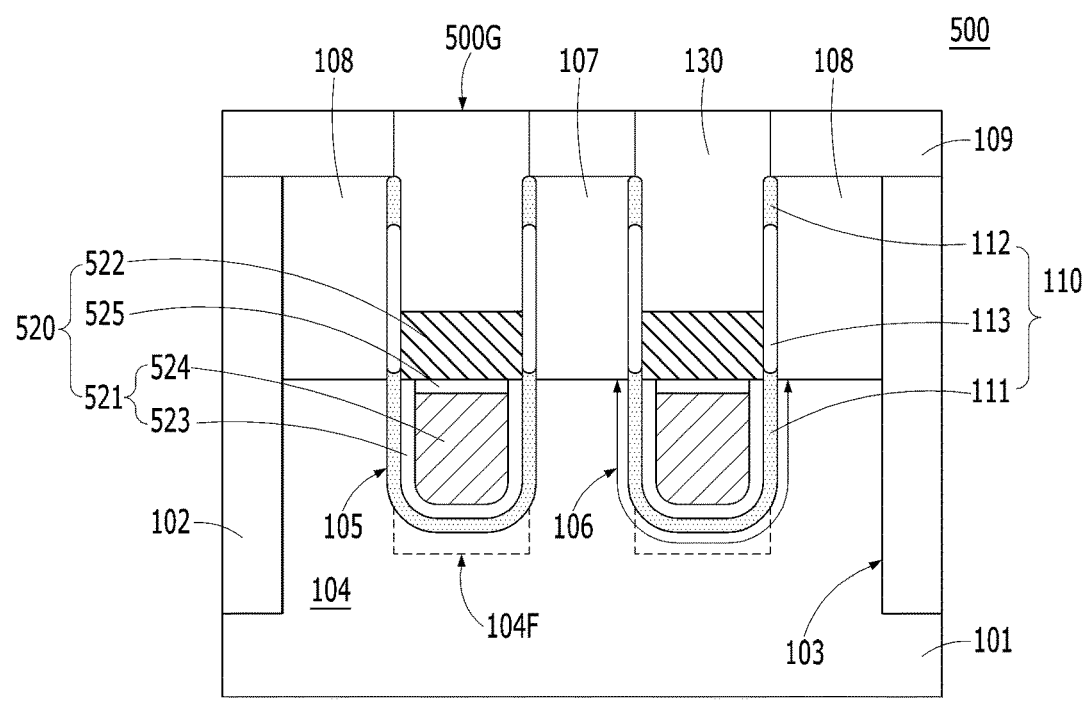

FIG. 6 is a cross-sectional view illustrating a semiconductor device 500 in accordance with an embodiment of the present disclosure. The other configurations of the semiconductor device 500 illustrated in FIG. 6 may be similar to those of the semiconductor device 300 illustrated in FIG. 4, except for a buried gate structure 500G. Hereinafter, in the present embodiment, detailed descriptions of configurations overlapping with those of the semiconductor device 300 will be omitted. Referring to FIG. 6, the semiconductor device 500 may include the buried gate structure 500G.

The buried gate structure 500G may include a gate dielectric structure 110 covering the bottom surface and side walls of a trench 105, and a gate electrode 520 and a capping layer 130 which are sequentially stacked to fill the trench 105 on the gate dielectric structure 110. The gate electrode 520 may include a stack of a lower buried portion 521 and an upper buried portion 522. The lower buried portion 521 may include a first barrier layer 523 and a low resistance gate electrode 524. A second barrier layer 525 may be formed between the lower buried portion 521 and the upper buried portion 522.

The first barrier layer 523 and the low resistance gate electrode 524 may correspond to the barrier layer 323 and the low resistance gate electrode 324 of FIG. 4, respectively. For example, the low resistance gate electrode 524 may be formed of tungsten (W), and the first barrier layer 523 may be formed of titanium nitride (TiN). Accordingly, the lower buried portion 521 may include a stack of TiN/W. The upper buried portion 522 may include a low work function material. The upper buried portion 522 may include N-type polysilicon.

The second barrier layer 525 may be formed on the low resistance gate electrode 524. The second barrier layer 525 may be formed between the low resistance gate electrode 524 and the upper buried portion 522. The first and second barrier layers 523 and 525 may be the same material or different materials. The second barrier layer 525 may include metal nitride. The second barrier layer 525 may be nitride of the lower buried portion 521. In other words, the second barrier layer 525 may be a material obtained by nitriding the top surface of the lower buried portion 521. When the low resistance gate electrode 524 includes tungsten, the second barrier layer 525 may be tungsten nitride. The second barrier layer 525 may be formed by plasma nitridation. In some embodiments, the second barrier layer 525 may be formed by plasma oxidation. When the low resistance gate electrode 524 includes tungsten, the second barrier layer 525 may be tungsten oxide. The second barrier layer 525 may be extremely thin. The second barrier layer 525 may be selectively formed only on the top surface of the low resistance gate electrode 524. In some embodiments, the second barrier layer 525 may also be formed on the top surface of the first barrier layer 523. When the first barrier layer 523 includes titanium nitride, the second barrier layer 525 may include nitrogen-rich titanium nitride.

In some embodiments, an air gap 113 of FIG. 6 may be increased in height in the same manner as the air gap 213 of FIG. 3.

Figure 7:
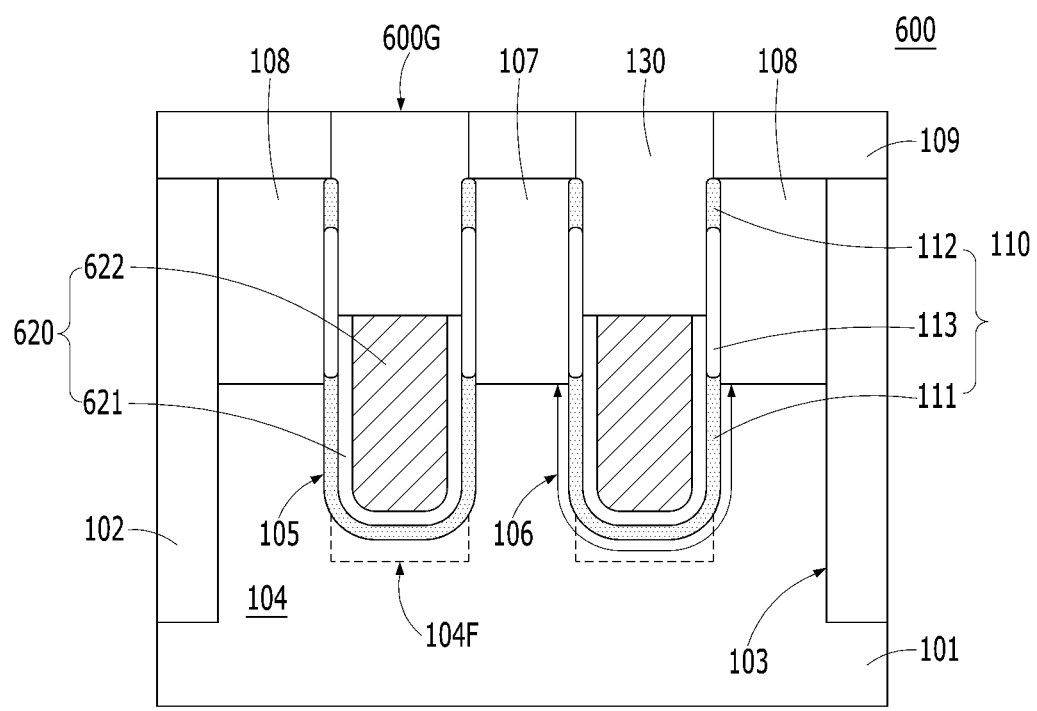

FIG. 7 is a cross-sectional view illustrating a semiconductor device 600 in accordance with an embodiment of the present disclosure. The other configurations of the semiconductor device 600 illustrated in FIG. 7 may be similar to those of the semiconductor device 100 illustrated in FIG. 2A, except for a buried gate structure 600G. Hereinafter, in the present embodiment, detailed descriptions of configurations overlapping with those of the semiconductor device 100 will be omitted. Referring to FIG. 7, the semiconductor device 600 may include the buried gate structure 600G.

The buried gate structure 600G may include a gate dielectric structure 110 covering the bottom surface and side walls of a trench 105, and a gate electrode 620 and a capping layer 130 which are sequentially stacked to fill the trench 105 on the gate dielectric structure 110. The gate electrode 620 may include a stack of a barrier layer 621 and a low resistance gate electrode 622. Each of the barrier layer 621 and the low resistance gate electrode 622 may include a metal-based material. For example, the low resistance gate electrode 622 may be formed of tungsten (W), and the barrier layer 621 may be formed of titanium nitride (TiN). Accordingly, the gate electrode 620 may include a stack of TiN/W. The gate electrode 620 may be a single gate. The gate electrodes of FIGS. 2A, 2B and 3 to 6 may be dual gates.

An air gap 113 may cover a part of the upper side walls of the gate electrode 620.

In some embodiments, the air gap 113 of FIG. 7 may be increased in height in the same manner as the air gap 213 of FIG. 3.

FIGS. 8A to 8K are cross-sectional views illustrating an example of a method for forming a semiconductor device in accordance with an embodiment of the present disclosure. FIGS. 8A to 8K illustrate an example of a method for forming the semiconductor device 300 of FIG. 4.

Figure 8A:
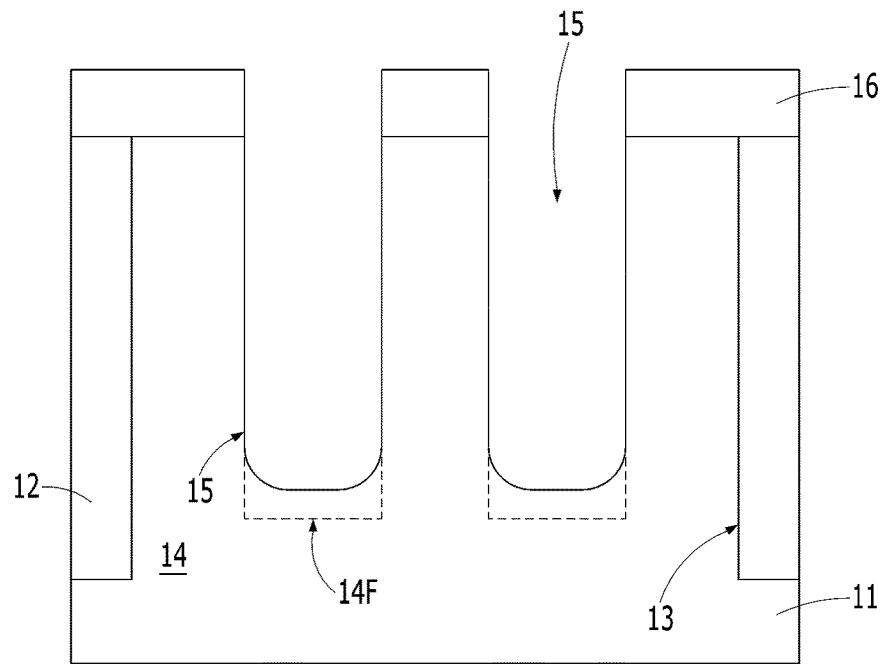
FIGS. 8A to 8K are cross-sectional views illustrating an example of a method for forming a semiconductor device in accordance with an embodiment of the present disclosure.

As illustrated in FIG. 8A, an isolation layer 12 is formed in a substrate 11. An active region 14 is defined by the isolation layer 12. The isolation layer 12 may be formed by a shallow trench isolation (STI) process. For example, an isolation trench 13 may be formed by etching the substrate 11. The isolation trench 13 may be filled with a dielectric material to form the isolation layer 12. The isolation layer 12 may include silicon oxide, silicon nitride or a combination thereof. The isolation trench 13 may be filled with a dielectric material through a chemical vapor deposition (CVD) process or another deposition process. Also, a planarization process such as chemical-mechanical polishing (CMP) may be additionally performed.

A trench 15 is formed in the substrate 11. The trench 15 may have a line shape crossing the active region 14 and the isolation layer 12. The trench 15 may be formed by a process of etching the substrate 11 using a hard mask layer 16 as an etch mask. The hard mask layer 16 may be formed on the substrate 11, and have a line-shaped opening. The hard mask layer 16 may be formed of a material having an etch selectivity to the substrate 11. The hard mask layer 16 may be silicon oxide, such as Tetra-Ethyl-Ortho-Silicate (TEOS). The trench 15 may be formed to be shallower than the isolation trench 13. The trench 15 may be sufficiently deep to make a large average cross-sectional area of a gate electrode, which is to subsequently be formed. Thus, the resistance of the gate electrode may be decreased. In some embodiments, the bottom edge of the trench 15 may have a curvature.

Subsequently, a fin region 14F may be formed. The fin region 14F may be formed by selectively recessing the isolation layer 12 below the trench 15. For the structure of the fin region 14F, the reference may be made to the fin region 104F of FIG. 2B.

Figure 8B:
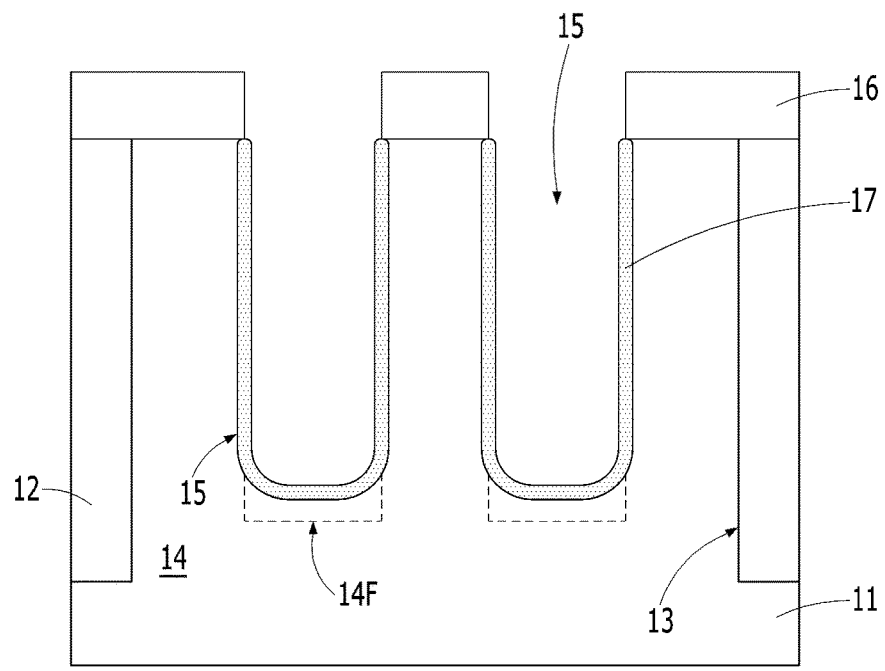

As illustrated in FIG. 8B, an initial gate dielectric layer 17 may be formed on the surface of the trench 15. The bottom surface and side walls of the trench 15 may be lined with the initial gate dielectric layer 17. Before the initial gate dielectric layer 17 is formed, the surface of the trench 15 that is damaged from the etch process may be recovered. For example, sacrificial oxide may be formed by a thermal oxidation treatment, and then the sacrificial oxide may be removed.

The initial gate dielectric layer 17 may be formed by a thermal oxidation process. The initial gate dielectric layer 17 may include silicon oxide.

In some embodiments, the initial gate dielectric layer 17 may be formed by a deposition process, such as a chemical vapor deposition (CVD) process or an atomic layer deposition (ALD) process. The initial gate dielectric layer 17, which is formed by the deposition process, may include a high-k material, oxide, nitride, oxynitride or combinations thereof. The high-k material may include a hafnium-containing material. The hafnium-containing material may include hafnium oxide, hafnium silicon oxide, hafnium silicon oxynitride or combinations thereof. In some embodiments, the high-k material may include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The initial gate dielectric layer 17 may include a material having a high areal density of oxygen atoms.

The trench 15 lined with the initial gate dielectric layer 17 may be referred to as a "lined trench".

Figure 8C:
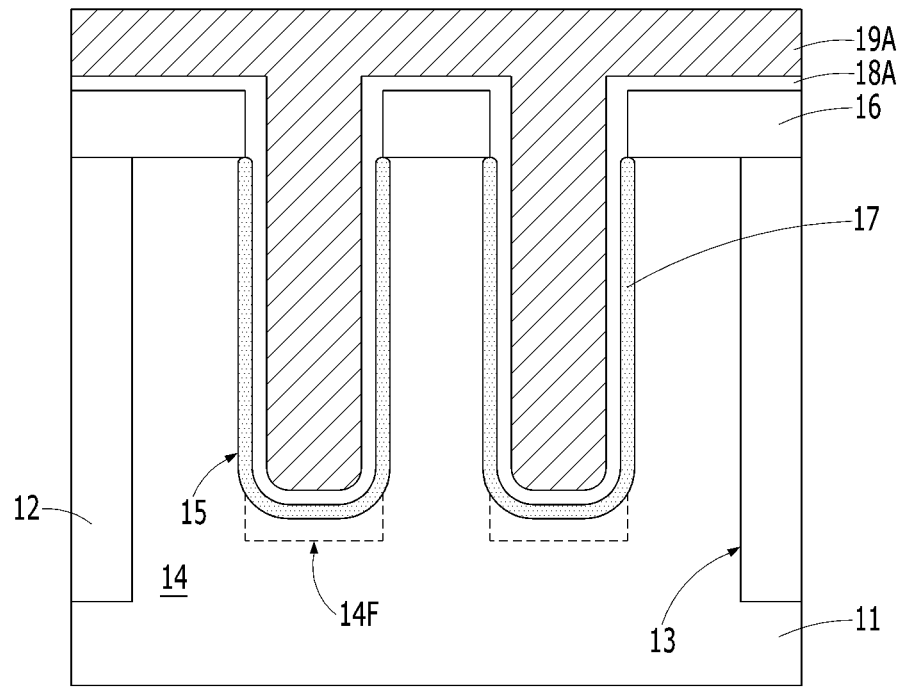

As illustrated in FIG. 8C, a barrier material 18A may be formed on the initial gate dielectric layer 17 and the hard mask layer 16. The barrier material 18A may be conformally formed on the surface of the initial gate dielectric layer 17. The barrier material 18A may include a metal-based material. The barrier material 18A may include metal nitride. The barrier material 18A may include titanium nitride or tantalum nitride. The barrier material 18A may be formed using the ALD or CVD process.

A first conductive layer 19A may be formed on the barrier material 18A. The first conductive layer 19A may fill the trench 15 on the barrier material 18A. The first conductive layer 19A includes a low resistance metal material. The first conductive layer 19A may include tungsten. The first conductive layer 19A may be formed by the CVD or ALD process.

Figure 8D:
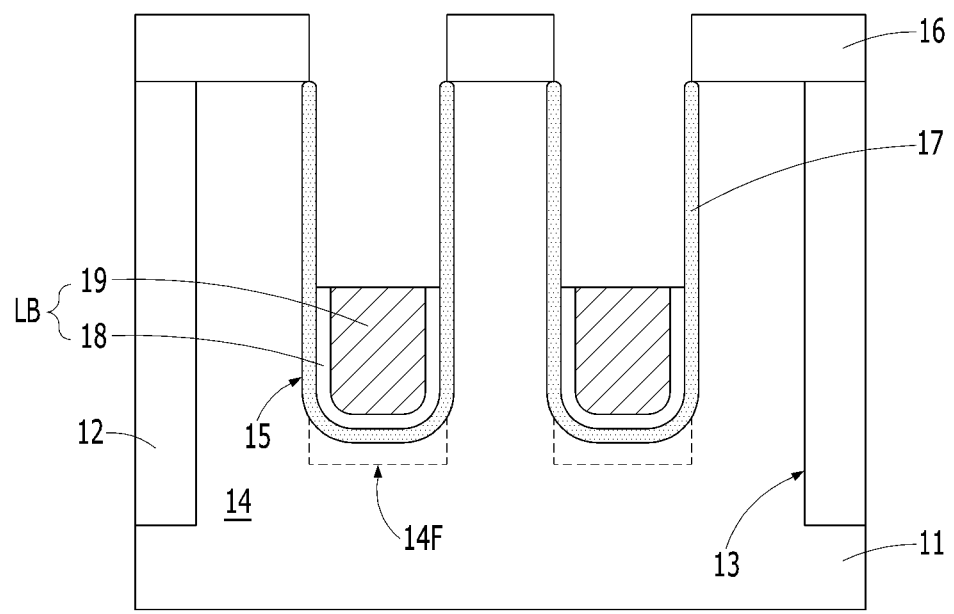

As illustrated in FIG. 8D, a barrier layer 18 and a lower gate electrode 19 may be formed in the trench 15. In order to form the barrier layer 18 and the lower gate electrode 19, a recessing process may be performed. The recessing process may be performed by a dry etch process, for example, an etch-back process. The etch-back process may be performed using plasma. The barrier layer 18 may be formed by performing the etch-back process on the barrier material 18A. The lower gate electrode 19 may be formed by performing the etch-back process on the first conductive layer 19A. In some embodiments, a planarization process may be performed first to expose the top surface of the hard mask layer 16, and then the etch-back process of the recessing process may be performed. The top surfaces of the barrier layer 18 and the lower gate electrode 19 may be located at the same level.

The top surfaces of the barrier layer 18 and the lower gate electrode 19 may be recessed at a lower level than the top surface of the active region 14. The barrier layer 18 and the lower gate electrode 19 may be abbreviated as a "lower buried portion LB".

After the barrier layer 18 and the lower gate electrode 19 are formed, the surface of the initial gate dielectric layer 17 may be partially exposed. The exposed surfaces of the initial gate dielectric layer 17 may be portions attacked during the process of forming the lower buried portion LB. For example, the exposed surfaces of the initial gate dielectric layer 17 may be portions attacked by plasma induced damage (PID) during the etch-back process.

Figure 8E:
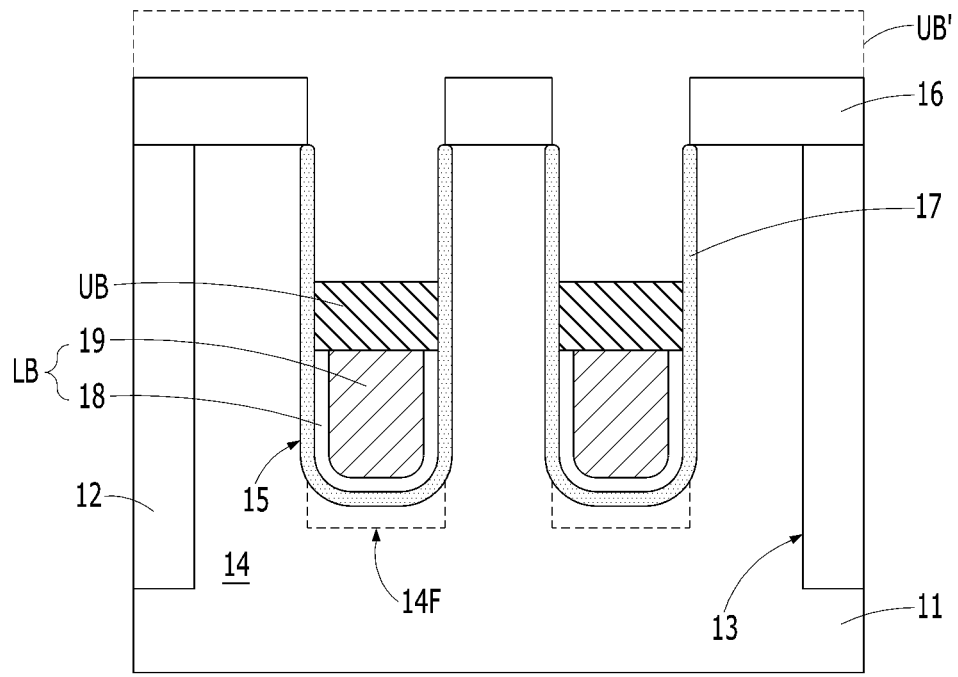

As illustrated in FIG. 8E, an upper buried portion UB may be formed on the lower buried portion LB. In order to form the upper buried portion UB, a second conductive layer UB' may be deposited to fill the trench 15 on the lower buried portion LB, and then a recessing process may be performed on the second conductive layer UB'. The recessing process on the second conductive layer UB' may be performed by a dry etch process, for example, an etch-back process. The upper buried portion UB may be formed by performing the etch-back process on the second conductive layer UB'. In some embodiments, a planarization process may be performed first to expose the top surface of the hard mask layer 16, and then the etch-back process of the recessing process may be performed on the second conductive layer UB'. The top surface of the upper buried portion UB may be located at a level lower than the top surface of the active region 14.

The second conductive layer UB', as the upper buried portion UB, may include a low work function material. The second conductive layer UB' may include low work function polysilicon, for example, polysilicon doped with an N-type impurity. The second conductive layer UB' may be formed by the CVD or ALD process.

The upper buried portion UB may be referred to as an "upper gate electrode". The upper buried portion UB may directly contact the lower buried portion LB. The upper buried portion UB may directly contact the barrier layer 18 and the lower gate electrode 19.

After the upper buried portion UB is formed, the surface of the initial gate dielectric layer 17 may be partially exposed. The exposed surfaces of the initial gate dielectric layer 17 may be portions attacked during the process of forming the upper buried portion UB. For example, the exposed surfaces of the initial gate dielectric layer 17 may be portions attacked by the PID during the etch-back process on the second conductive layer UB'.

Figure 8F:
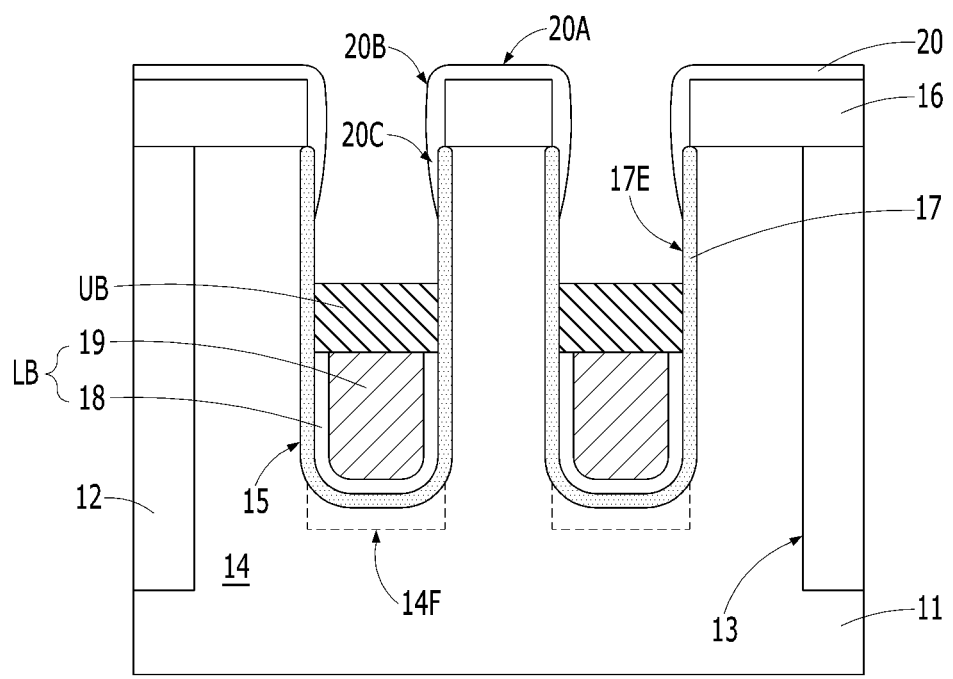

As illustrated in FIG. 8F, a sacrificial material 20 may be formed. The sacrificial material 20 may include a material having a selectivity with respect to the etch process on the initial gate dielectric layer 17. The sacrificial material 20 may include a material having a selectivity with respect to a wet etch process on the initial gate dielectric layer 17. The sacrificial material 20 may include a metal, metal nitride or nitride. The sacrificial material 20 may include titanium nitride, tantalum nitride, tungsten nitride or silicon nitride. In the present embodiment, the sacrificial material 20 may include titanium nitride (TiN).

The sacrificial material 20 may include a poor step coverage material. The poor step coverage material may be obtained by a plasma enhanced chemical vapor deposition (PECVD) process or a physical vapor deposition (PVD) process. For example, silicon nitride, as the sacrificial material 20, may be formed by the PECVD process, and the silicon nitride deposited by the PECVD has poor step coverage. As another example, titanium nitride, as the sacrificial material 20, may be formed by the PVD process, and the titanium nitride deposited by the PVD has poor step coverage. Deposition of poor step coverage materials may also refer to nonconformal formation.

The sacrificial material 20 may include first to third sacrificial portions 20A, 20B and 20C. The first sacrificial portion 20A may cover the top surface of the hard mask layer 16, the second sacrificial portion 20B may be extended from the first sacrificial portion 20A to cover the side walls of the hard mask layer 16, and the third sacrificial portion 20C may extend from the second sacrificial portion 20B to partially cover only an upper portion of the initial gate dielectric layer 17. The sacrificial material 20 may not cover the top surface of the upper buried portion UB. The sacrificial material 20 may be formed to have an overhang shape to partially cover the initial gate dielectric layer 17 only at the top corner of the trench 15. By overhang shape it is meant that the sacrificial material 20 projects sideways (i.e., in a direction parallel to the top surface of the substrate 11) beyond the side wall of the hard mask layer 16 and extends downward to cover the side wall of the hard mask layer 16 and the upper part of the initial gate dielectric layer 17. Hence, the part of the initial gate dielectric layer 17 that is at a level immediately above the top surface of the upper buried portion UB is not covered by the sacrificial material 17. This part may be referred to hereinafter also as the exposed part 17E of the initial gate dielectric layer 17.

As described above, a part of the initial gate dielectric layer 17 may be exposed by non-conformally forming the sacrificial material 20. The exposed portion 17E of the initial gate dielectric layer 17 may be located between the sacrificial material 20 and the upper buried portion UB. The exposed portion 17E of the initial gate dielectric layer 17 may have a minimum size so that a subsequent wet chemical may flow therethrough. The exposed portion 17E of the initial gate dielectric layer 17 may include a portion attacked by the PID.

Figure 8G:
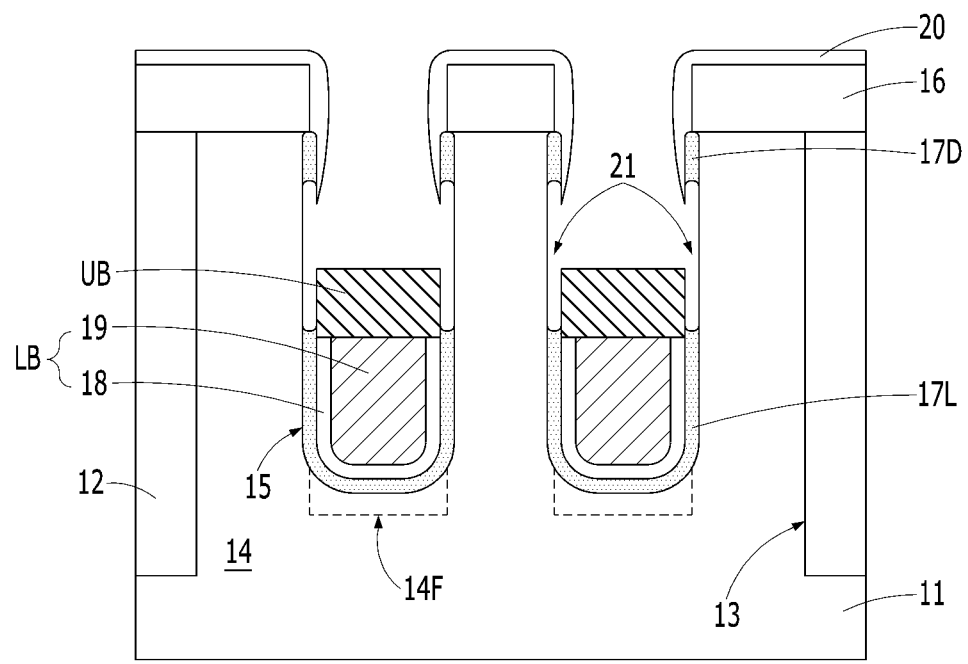

As illustrated in FIG. 8G, a side recess 21 may be formed. The side recess 21 may be formed by removing the exposed portion 17E of the initial gate dielectric layer 17. The exposed portion 17E of the initial gate dielectric layer 17 to be removed may be a portion attacked by the PID. A wet etch process may be performed to form the side recess 21. The wet etch process may selectively remove the exposed portion 17E of the initial gate dielectric layer 17 and may not remove the sacrificial layer 20 and the upper buried portion UB. The wet etch process may be performed using a wet chemical including hydrofluoric acid (HF).

The side recess 21 may partially expose the side walls of the trench 15. Wet etching may continue to enlarge the side recess 21 to partially expose the side walls of the upper buried portion UB, so that the bottom surface of the side recess 21 may be located at a higher level than the top surface of the lower buried portion LB as illustrated in FIG. 8G Hence, wet etching may be terminated before the side recess 21 reaches the bottom edge of the side walls of the upper buried portion UB.

The initial gate dielectric layer 17 may be divided into a first gate dielectric layer 17L and a second gate dielectric layer 17D by the side recess 21. The first gate dielectric layer 17L may have a 'U' shape covering the side walls and bottom surface of the lower buried portion LB. The first gate dielectric layer 17L may directly contact the side walls and bottom surface of the lower buried portion LB. An upper surface of the first gate dielectric layer 17L may be at a level higher than a bottom surface of the upper buried portion UB. The first gate dielectric layer 17L may directly contact the lower side walls and bottom of the trench 15. The second gate dielectric layer 17D may remain on the uppermost side walls of the trench 15. The second gate dielectric layer 17D may be in direct contact with the uppermost side walls of the trench 15. The side recess 21 may be located between the second gate dielectric layer 17D and the first gate dielectric layer 17L. In other words, the second gate dielectric layer 17D and the first gate dielectric layer 17L may be discontinuous with each other because of the side recess 21.

As described above, as the side recess 21 is formed, the exposed portion 17E of the initial gate dielectric layer 17, that is, the portion attacked by the PID, may be removed.

Figure 8H:
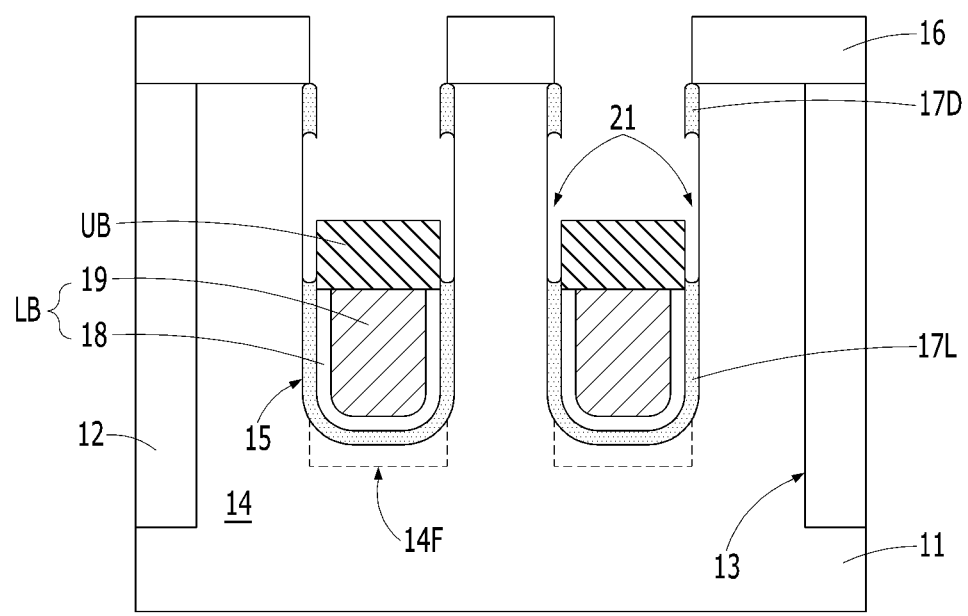

As illustrated in FIG. 8H, the sacrificial material 20 may be removed. The sacrificial material 20 may be removed by a wet etch process, in which case the hard mask layer 16, the second gate dielectric layer 17D, the first gate dielectric layer 17L and the upper gate electrode UB remain intact or substantially intact. The wet chemical for removing the sacrificial material 20 may have a high etch selectivity for the sacrificial material relative to the to the second gate dielectric layer 17D, the first gate dielectric layer 17L and the upper gate electrode UB so that only the sacrificial material 20 may be selectively removed.

Figure 8I:
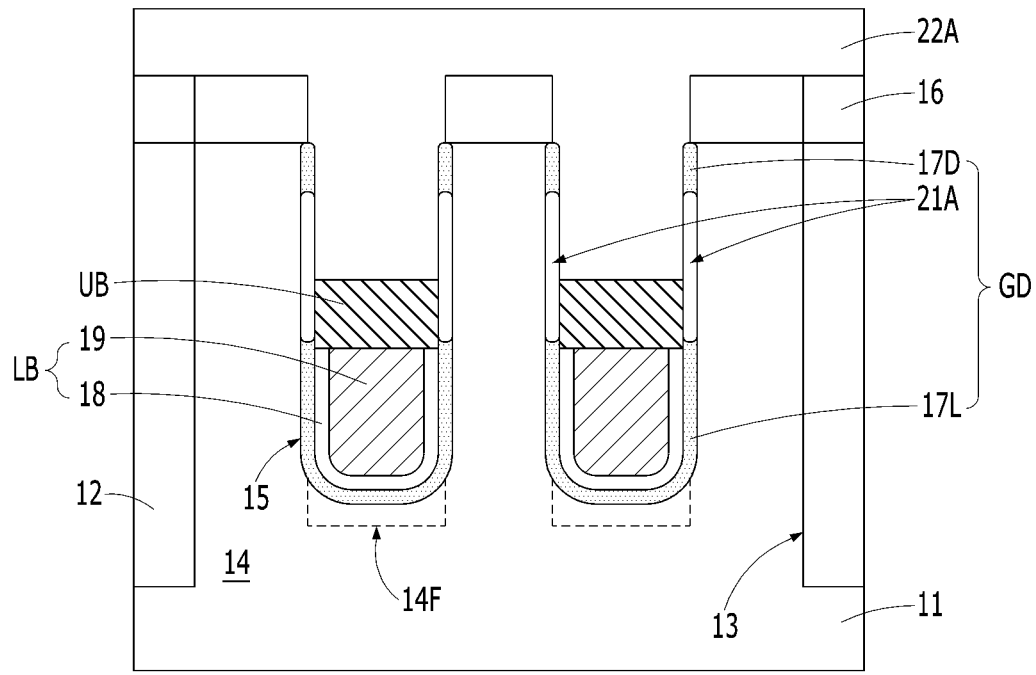

As illustrated in FIG. 8I, a capping layer 22A is formed on the upper buried portion UB. The capping layer 22A includes a dielectric material. The capping layer 22A may include silicon nitride. The capping layer 22A may have an oxide-nitride-oxide (ONO) structure.

As the capping layer 22A is formed, the side recess 21 remains as an air gap 21A. Thus, one side of the air gap 21A may be covered by the capping layer 22A and the upper side wall of the upper buried portion UB (i.e., the side wall of the upper buried portion UB except for the lowermost part thereof which is covered by the first gate dielectric material 17L) while the other side of the air gap 21A is a part of the side wall of the trench 15. The air gap 21A may be located between the upper side wall of the upper buried portion UB and a part of the side wall of the trench 15 that is adjacent to the upper sidewall of the upper buried portion UB, and extended upwardly to be located between the capping layer 22A and the upper side wall of the trench 15. The uppermost part of the air gap 21A may directly contact the second gate dielectric layer 17D, and the lowermost part of the air gap 21A may directly contact the first gate dielectric layer 17L. In other words, the air gap 21A may be enclosed between the first gate dielectric layer 17L, the upper buried portion UB, the capping layer 22A, the second gate dielectric layer 17D and the trench 15.

To prevent the capping layer 22A from filling the air gap 21 the capping layer 22A is selected to include a poor step coverage material. This way the size of the air gap may be sufficiently secured.

The first gate dielectric layer 17L, the second gate dielectric layer 17D and the air gap 21A may become a gate dielectric structure GD. The air gap 21A may be vertically formed between the first gate dielectric layer 17L and the second gate dielectric layer 17D. The air gap 21A may be referred to as a "vertical air gap".

Figure 8J:
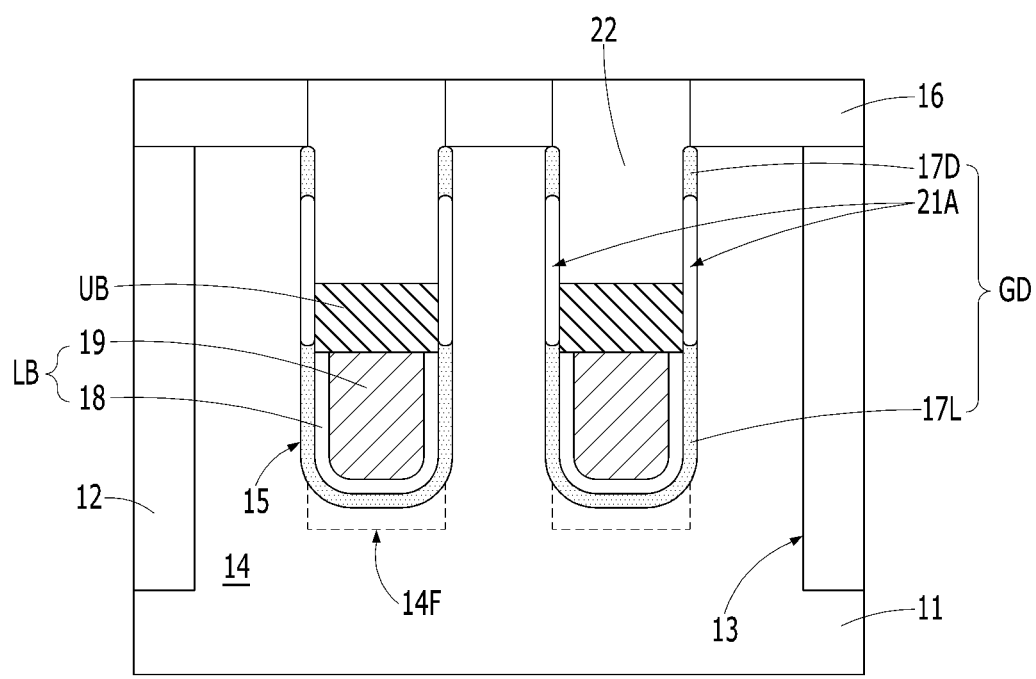

Subsequently, as illustrated in FIG. 8J, the capping layer 22A may be planarized to expose the top surface of the hard mask layer 16. As a result, a capping layer 22 that fills the trench 15 may remain.

By a series of processes described above, a buried gate structure is formed. The buried gate structure may include the first gate dielectric layer 17L, the barrier layer 18, the lower gate electrode 19, the upper buried portion UB and the capping layer 22. The top surface of the upper buried portion UB is located at a level lower than the top surface of the active region 14. As such, as the top surface of the upper buried portion UB is recessed low, a physical distance between the upper buried portion UB and a peripheral conductive material, for example, a contact plug, may be sufficiently secured.

Figure 8K:
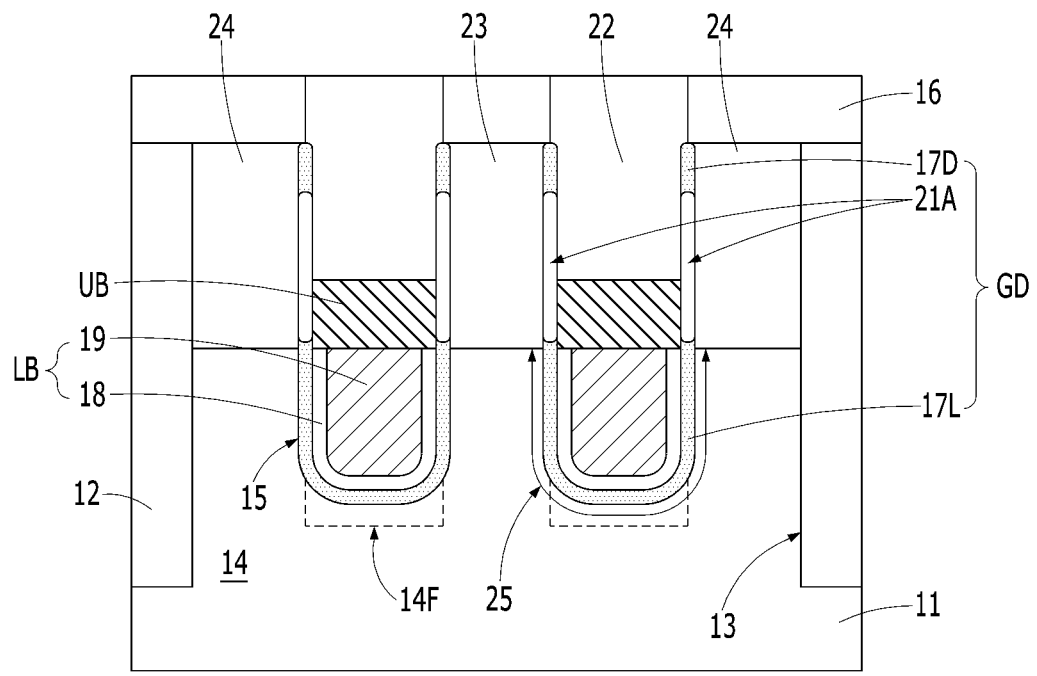

As illustrated in FIG. 8K, after the capping layer 22 is formed, an impurity doping process is performed by implanting or other doping techniques. Accordingly, a first doped region 23 and a second doped region 24 are formed in the substrate 11. The first and second doped regions 23 and 24 may have depths that horizontally overlap the upper buried portion UB. The air gap 21A may horizontally overlap the first and second doped regions 23 and 24. The barrier layer 18 and the lower gate electrode 19 may not horizontally overlap with the first and second doped regions 23 and 24.

As the first and second doped regions 23 and 24 are formed, a channel 25 may be defined along the surface of the trench 15. In other words, the entire length of the channel 25 is defined to cover the lower buried portion LB.

The first gate dielectric layer 17L may be located between the lower buried portion LB and the channel 25. The air gap 21A may be located between the upper buried portion UB and the first and second doped regions 23 and 24. In other words, the gate dielectric structure including the first gate dielectric layer 17L may be located between the lower buried portion LB and the channel 25, and the gate dielectric structure including the air gap 21A may be located between the upper buried portion UB and the first and second doped regions 23 and 24.

The second gate dielectric layer 17D may serve to prevent the air gap 21A from being exposed, during a subsequent process, for example, while a contact plug (not illustrated) coupled to the first and second doped regions 23 and 24 is formed.

In the present embodiment, since the part of the initial gate dielectric layer 17, attacked by the PID, is removed while the lower and upper buried portions LB and UB are formed, a GIDL may be improved. Also, as the air gap 21A is formed between the upper buried portion UB and the first and second doped regions 23 and 24, the GIDL may be further improved. In addition, since the thickness or width of the air gap 21A can be controlled to be as thin as the initial gate dielectric layer 17, the reliability, of the device, such as a write-recovery time (TWR), may be improved.

The present invention method is advantageous because even though the thickness of the initial gate dielectric layer 17 decreases due to higher integration, the air gap 21A may be easily formed.

Figure 9A:
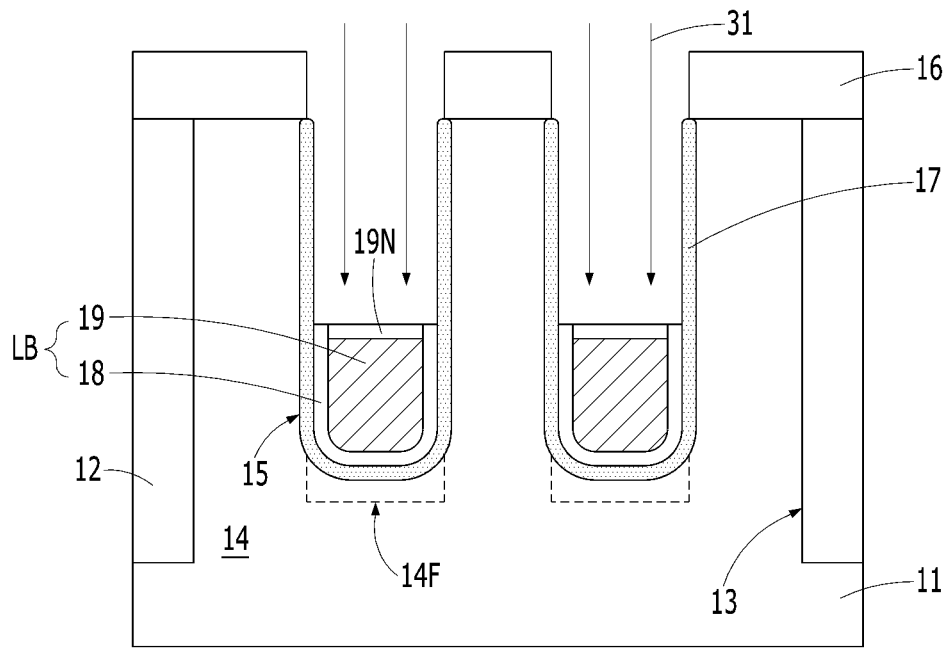
FIGS. 9A and 9B are cross-sectional views illustrating another example of a method for forming a semiconductor device of the present disclosure.
Figure 9B:
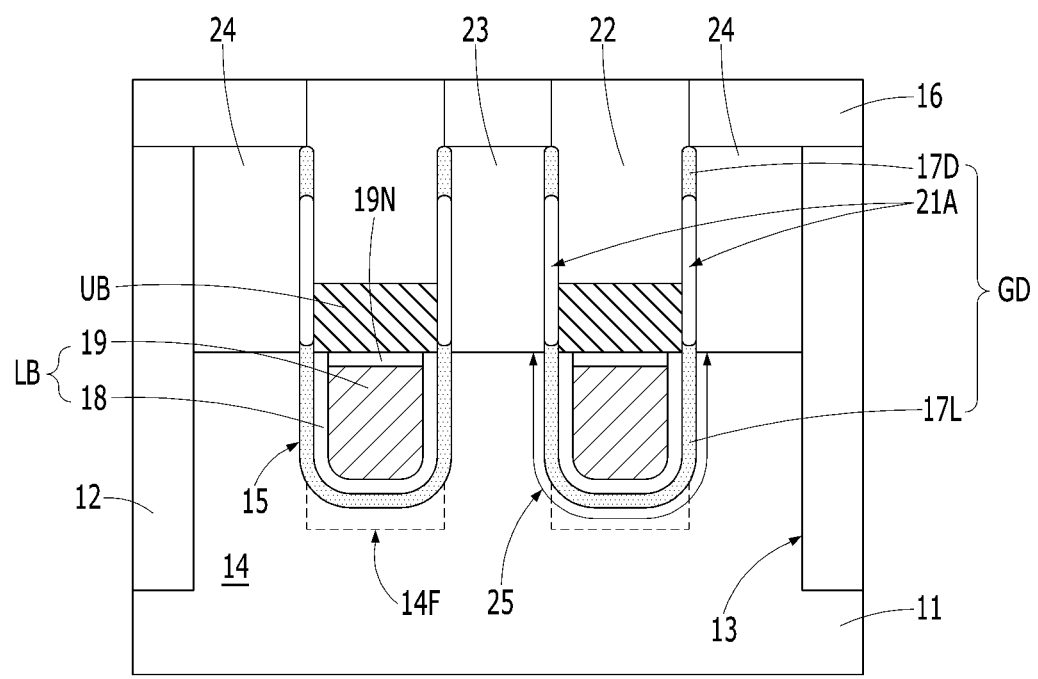

FIGS. 9A and 9B are cross-sectional views illustrating another example of a method for forming a semiconductor device. The method illustrated in FIGS. 9A and 9B may be similar to the method illustrated in FIGS. 8A to 8J.

Through the method illustrated in FIGS. 8A to 8D, a lower buried portion LB may be formed.

Subsequently, as illustrated in FIG. 9A, a plasma treatment 31 may be performed. The plasma treatment 31 may be performed in an atmosphere of a nitrogen-containing gas or an oxygen-containing gas. The plasma treatment 31 may include plasma nitridation or plasma oxidation.

The top surface of the lower buried portion LB may be modified by the plasma treatment 31. For example, the top surface of the lower buried portion LB may be nitrided by plasma nitridation to form a nitrided barrier layer. The nitrided barrier layer 19N may be a portion in which the top surface of a lower gate electrode 19 is nitrided. The nitrided barrier layer 19N may be a surface nitride of the lower gate electrode 19. For example, when the lower gate electrode 19 includes tungsten, the nitrided barrier layer 19N may be tungsten nitride.

As described above, the nitrided barrier layer 19N may be selectively formed only on the top surface of the lower buried portion LB.

As illustrated in FIG. 9B, an upper buried portion UB may be formed on the nitrided barrier layer 19N. A method for forming the upper buried portion UB is described above with reference to FIG. 8E. The nitrided barrier layer 19N may be located between the lower buried portion LB and the upper buried portion UB.

Subsequently, a series of processes illustrated in FIGS. 8F to 8J may be performed. Through the method illustrated in FIG. 8F to 8J, an air gap 21A and a capping layer 22 may be formed. Subsequently, through the method illustrated in FIG. 8K, first and second doped regions 23 and 24 may be formed.

Figure 10:
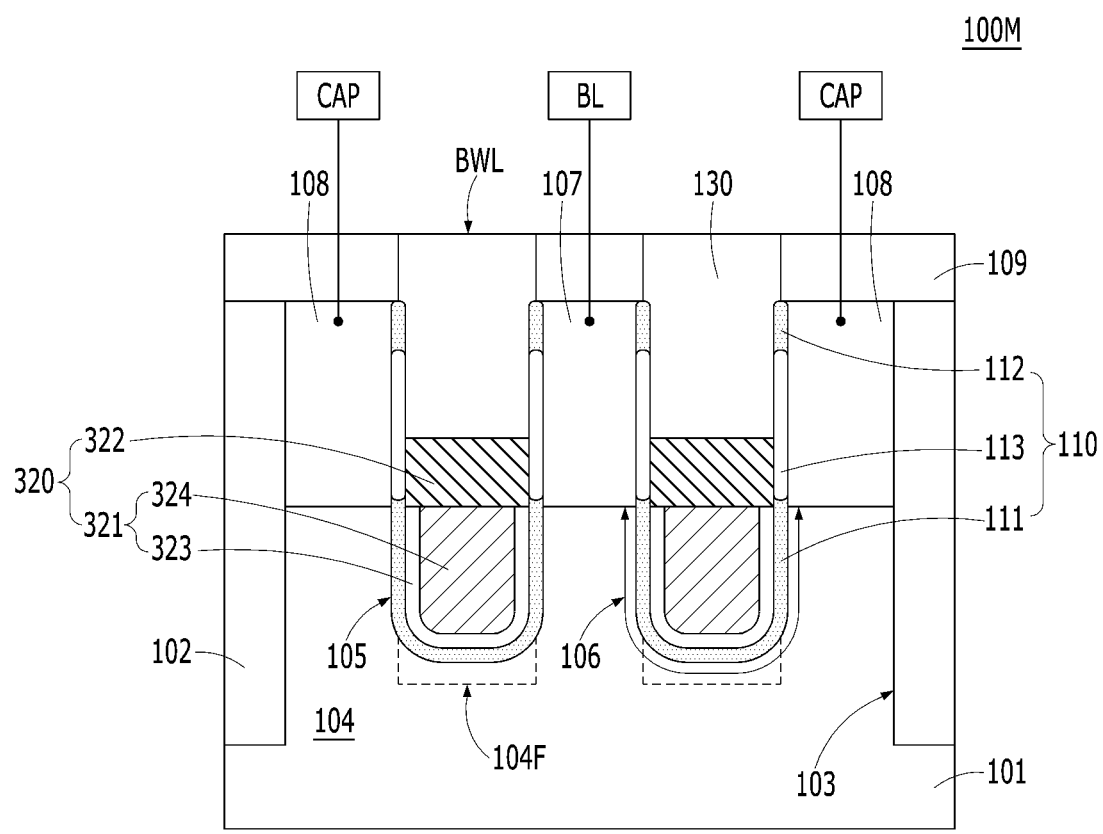
FIG. 10 is a cross-sectional view illustrating a memory cell.

FIG. 10 is a cross-sectional view illustrating a memory cell 100M.

Referring to FIG. 10, the memory cell 100M may include a cell transistor, a bit line BL and a capacitor CAP. The cell transistor may include the semiconductor device 300 of FIG. 4. Accordingly, the cell transistor may include a buried gate structure BWL, a channel 106, a first doped region 107 and a second doped region 108. The first doped region 107 may be electrically connected to the bit line BL. The second doped region 108 may be electrically connected to the capacitor CAP.

In the memory cell 100M, the buried gate structure BWL may be referred to as a buried word line structure BWL. The buried word line structure BWL may be embedded in a trench 105. The buried word line structure BWL may include a gate dielectric structure 110, a gate electrode 320 and a capping layer 130. The gate electrode 320 may include a lower buried portion 321 and an upper buried portion 322. The lower buried portion 321 may include a barrier layer 323 and a lower gate electrode 324.

The gate dielectric structure 110 may include a first gate dielectric layer 111, a second gate dielectric layer 112 and an air gap 113.

The buried word line structure BWL may be replaced with any one of the buried gate structures 100G, 200G, 400G, 500G and 600G in accordance with the above-described embodiments.

The capacitor CAP may include a storage node, a dielectric layer and a plate node. The storage node may have a cylindrical shape, a pillar shape, or a combination thereof. The dielectric layer may be formed on the surface of the storage node. The dielectric layer may be formed directly on the surface of the storage node. The dielectric layer may include at least one selected from zirconium oxide, aluminum oxide and hafnium oxide. For example, the dielectric layer may have a ZAZ ($ZrO_2/Al_2O_3/ZrO_2$) structure where first zirconium oxide, aluminum oxide and second zirconium oxide are stacked. The plate node may be formed on the dielectric layer. The plate node may be formed directly on the dielectric layer. The storage node and the plate node may include a metal or a metal-containing material.

The memory cell 100M may be a part of a Dynamic Random-Access Memory (DRAM). When the memory cell 100M is applied to the DRAM, the refresh characteristics of the DRAM may be improved. Also, it is possible to prevent off-leakage, which leads to improved retention time.

According to embodiments, PID of a gate dielectric structure is removed, thereby decreasing a GIDL.

Also, according to embodiments, a gate dielectric structure including an air gap is formed, thereby further decreasing the GIDL.

Further, according to embodiments, a low work function gate electrode is formed, thereby further decreasing the GIDL.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for fabricating a semiconductor device, comprising:
    forming a trench in a substrate;
    lining a surface of the trench with an initial gate dielectric layer;
    forming a gate electrode to partially fill the lined trench;
    forming a sacrificial material spaced apart from a top surface of the gate electrode and to selectively cover a top corner of the lined trench;
    removing a part of the initial gate dielectric layer of the lined trench which is exposed by the sacrificial material in order to form an air gap; and
    forming a capping layer to cap a side surface of the air gap, over the gate electrode.

2. The method of claim 1, wherein a bottom surface of the air gap is located at a level lower than the top surface of the gate electrode, and a top surface of the air gap is located at a level higher than the top surface of the gate electrode.

3. The method of claim 1, wherein the sacrificial material is formed to have an overhang shape for selectively covering the top corner of the lined trench.

4. The method of claim 1, wherein the sacrificial material includes a material having an etch selectivity to the initial gate dielectric layer.

5. The method of claim 1, wherein the sacrificial material includes metal nitride or silicon nitride.

6. The method of claim 1, wherein the sacrificial material is formed using physical vapor deposition or plasma enhanced chemical vapor deposition.

7. The method of claim 1, wherein the removing of the part of the initial gate dielectric layer of the lined trench includes performing a wet etch process on the part of the initial gate dielectric layer of the lined trench.

8. The method of claim 1, wherein, in the removing of the part of the initial gate dielectric layer of the lined trench, the initial gate dielectric layer is divided into a first gate dielectric layer contacting a bottom surface of the air gap and a second gate dielectric layer contacting a top surface of the air gap.

9. The method of claim 8, wherein the first and second gate dielectric layers are vertically located with the air gap interposed therebetween.

10. The method of claim 8, wherein the first gate dielectric layer contacts side walls and a bottom surface of the gate electrode, and the second gate dielectric layer contacts some side walls of the capping layer.

11. A method for fabricating a semiconductor device, comprising:
    forming a trench in a substrate;
    lining a surface of the trench with an initial gate dielectric layer;
    forming a lower buried portion to partially fill the lined trench;
    forming an upper buried portion over the lower buried portion;
    forming a sacrificial material spaced apart from a top surface of the upper buried portion and to selectively cover a top corner of the lined trench;
    removing a part of the initial gate dielectric layer of the lined trench which is exposed by the sacrificial material, in order to form an air gap that horizontally overlaps side walls of the upper buried portion; and
    forming a capping layer to cap a side surface of the air gap, over the upper buried portion.

12. The method of claim 11, wherein a bottom surface of the air gap is located at a level lower than the top surface of the upper buried portion, and a top surface of the air gap is located at a level higher than the top surface of the upper buried portion.

13. The method of claim 11, wherein the sacrificial material includes a material having an etch selectivity to the initial gate dielectric layer.

14. The method of claim 11, wherein the sacrificial material includes metal nitride or silicon nitride.

15. The method of claim 11, wherein the sacrificial material is formed to have an overhang shape for selectively covering the top corner of the lined trench, and physical vapor deposition or plasma enhanced chemical vapor deposition is performed to form the overhang shape.

16. The method of claim 11, wherein the removing of the part of the initial gate dielectric layer of the lined trench includes performing a wet etch process on the part of the initial gate dielectric layer of the lined trench.

17. The method of claim 11, wherein, in the removing of the part of the initial gate dielectric layer of the lined trench,
    the initial gate dielectric layer is divided into a first gate dielectric layer contacting a bottom surface of the air gap and a second gate dielectric layer contacting a top surface of the air gap, and
    the first and second gate dielectric layers are vertically located with the air gap interposed therebetween.

18. The method of claim 11, wherein the lower buried portion includes a metal-based material, and the upper buried portion includes a low work function material.

19. The method of claim 11, further comprising performing a plasma treatment to form a barrier layer between the lower buried portion and the upper buried portion.

* * * * *